United States Patent
Kelley et al.

(10) Patent No.: US 8,947,889 B2
(45) Date of Patent: Feb. 3, 2015

(54) CONFORMAL ELECTROMAGNETIC (EM) DETECTOR

(75) Inventors: Matthew Kelley, Orlando, FL (US); Christian Adams, Yalaha, FL (US); Richard Reim, Oviedo, FL (US)

(73) Assignee: Lockheed Martin Corporation, Bethesda, MD (US)

( * ) Notice: Subject to any disclaimer, the term of this patent is extended or adjusted under 35 U.S.C. 154(b) by 489 days.

(21) Appl. No.: 13/211,131

(22) Filed: Aug. 16, 2011

(65) Prior Publication Data

US 2012/0091456 A1    Apr. 19, 2012

Related U.S. Application Data

(63) Continuation-in-part of application No. 12/904,854, filed on Oct. 14, 2010, now Pat. No. 8,716,606.

(51) Int. Cl.
| | |
|---|---|
| *H05K 7/14* | (2006.01) |
| *H05K 7/18* | (2006.01) |
| *H05K 9/00* | (2006.01) |

(Continued)

(52) U.S. Cl.
CPC ............ *H01L 23/573* (2013.01); *H01L 27/305* (2013.01); *H01L 27/308* (2013.01); *H05K 1/0275* (2013.01); *H01L 2924/09701* (2013.01); *H01L 2924/12044* (2013.01); *H01L 2924/3011* (2013.01); *H05K 3/284* (2013.01); *H05K 2201/09872* (2013.01); *H01L 2924/0002* (2013.01)
USPC ............ 361/800; 361/816; 361/818; 174/386

(58) Field of Classification Search
CPC ................... H05K 3/284; H05K 2201/09872; H05K 1/0275; H01L 2924/12044; H01L 27/308; H01L 2924/09701; H01L 23/573; H01L 27/305; H01L 2924/3011
USPC ............... 361/816, 679.01–679.61, 737, 752, 361/753, 796–812, 760–765, 792, 818; 257/666–738, 49, 659, 788–790; 455/575.1–575.9; 454/184; 174/250–261, 382, 384, 386, 262, 520
See application file for complete search history.

(56) References Cited

U.S. PATENT DOCUMENTS

| | | | |
|---|---|---|---|
| 3,931,454 A | 1/1976 | Sprengling | |
| 4,250,384 A * | 2/1981 | Pulvari | 250/330 |

(Continued)

FOREIGN PATENT DOCUMENTS

| | | |
|---|---|---|
| CA | 2011205 A1 | 8/1991 |
| EP | 0079589 A1 | 5/1983 |

(Continued)

OTHER PUBLICATIONS

Non-final Office Action for U.S. Appl. No. 12/904,854 mailed Feb. 28, 2013, 8 pages.

(Continued)

*Primary Examiner* — Tuan T Dinh
*Assistant Examiner* — Ahmad D Barnes
(74) *Attorney, Agent, or Firm* — Withrow & Terranova, PLLC

(57) ABSTRACT

A conformal electro-magnetic (EM) detector and a method of applying such a detector are provided herein as well as variations thereof Variations include, but are not limited to, single-element, area detectors; an array of multiple active elements.

23 Claims, 10 Drawing Sheets

(51) Int. Cl.
*H01L 23/00* (2006.01)
*H01L 27/30* (2006.01)
*H05K 1/02* (2006.01)
*H05K 3/28* (2006.01)

(56) References Cited

U.S. PATENT DOCUMENTS

| | | | |
|---|---|---|---|
| 5,159,629 A * | 10/1992 | Double et al. | 713/194 |
| 5,268,566 A | 12/1993 | Wakaumi et al. | |
| 5,512,738 A | 4/1996 | Yuen | |
| 5,538,756 A | 7/1996 | Korleski et al. | |
| 5,635,293 A | 6/1997 | Korleski et al. | |
| 5,759,625 A | 6/1998 | Laubacher et al. | |
| 5,847,650 A * | 12/1998 | Zhou et al. | 340/572.6 |
| 6,190,941 B1 | 2/2001 | Heinz et al. | |
| 6,203,912 B1 | 3/2001 | Watakabe et al. | |
| 6,233,339 B1 | 5/2001 | Kawano et al. | |
| 6,254,972 B1 | 7/2001 | Farquhar et al. | |
| 6,280,797 B1 | 8/2001 | Kuczynski et al. | |
| 6,421,013 B1 | 7/2002 | Chung | |
| 6,455,770 B2 * | 9/2002 | Pulver | 174/394 |
| 6,638,690 B1 | 10/2003 | Meier et al. | |
| 6,861,092 B2 | 3/2005 | McCarthy et al. | |
| 6,873,031 B2 | 3/2005 | McFadden et al. | |
| 6,970,360 B2 | 11/2005 | Sinha | |
| 7,037,580 B2 | 5/2006 | Razavi et al. | |
| 7,054,162 B2 * | 5/2006 | Benson et al. | 361/760 |
| 7,129,422 B2 * | 10/2006 | Arnold | 174/377 |
| 7,173,323 B2 | 2/2007 | Wolters et al. | |
| 7,175,876 B2 | 2/2007 | Free et al. | |
| 7,214,889 B2 | 5/2007 | Mazurkiewicz | |
| 7,274,289 B2 | 9/2007 | Kerr et al. | |
| 7,383,999 B2 | 6/2008 | Bi et al. | |
| 7,429,915 B2 * | 9/2008 | Cruzado et al. | 340/426.36 |
| 7,513,437 B2 | 4/2009 | Douglas | |
| 7,585,926 B2 | 9/2009 | Sato et al. | |
| 7,615,869 B2 * | 11/2009 | Koo et al. | 257/777 |
| 7,821,110 B2 * | 10/2010 | Kim et al. | 257/659 |
| 2002/0171157 A1 | 11/2002 | Soga et al. | |
| 2004/0155308 A1 * | 8/2004 | McFadden et al. | 257/422 |
| 2004/0222014 A1 | 11/2004 | Heffner | |
| 2005/0039935 A1 | 2/2005 | Kolb et al. | |
| 2007/0100043 A1 | 5/2007 | Shiono | |
| 2008/0108767 A1 | 5/2008 | Sato et al. | |
| 2008/0272885 A1 | 11/2008 | Atherton | |
| 2009/0047797 A1 | 2/2009 | Anderson et al. | |
| 2009/0243065 A1 | 10/2009 | Sugino et al. | |

FOREIGN PATENT DOCUMENTS

| | | |
|---|---|---|
| EP | 0159942 A2 | 10/1985 |
| EP | 0248617 A2 | 12/1987 |
| EP | 1117281 A1 | 7/2001 |
| EP | 1918339 A1 | 5/2008 |
| GB | 2109166 A | 5/1983 |
| JP | 60107391 A | 6/1985 |
| JP | 0250831 A | 2/1990 |
| JP | 0250833 A | 2/1990 |
| JP | 03277677 A | 12/1991 |
| JP | 09203445 A | 8/1997 |
| JP | 1088094 A | 4/1998 |
| WO | 03026371 A1 | 3/2003 |
| WO | 2008076473 A2 | 6/2008 |

OTHER PUBLICATIONS

Final Office Action for U.S. Appl. No. 12/904,854 mailed Jul. 25, 2013, 8 pages.
Applicant-Initiated Interview Summary for U.S. Appl. No. 12/904,854 mailed Oct. 2, 2013, 3 pages.
Advisory Action and Applicant-Initiated Interview Summary for U.S. Appl. No. 12/904,854 mailed Nov. 26, 2013, 4 pages.
Notice of Allowance for U.S. Appl. No. 12/904,854 mailed Dec. 16, 2013, 9 pages.

* cited by examiner

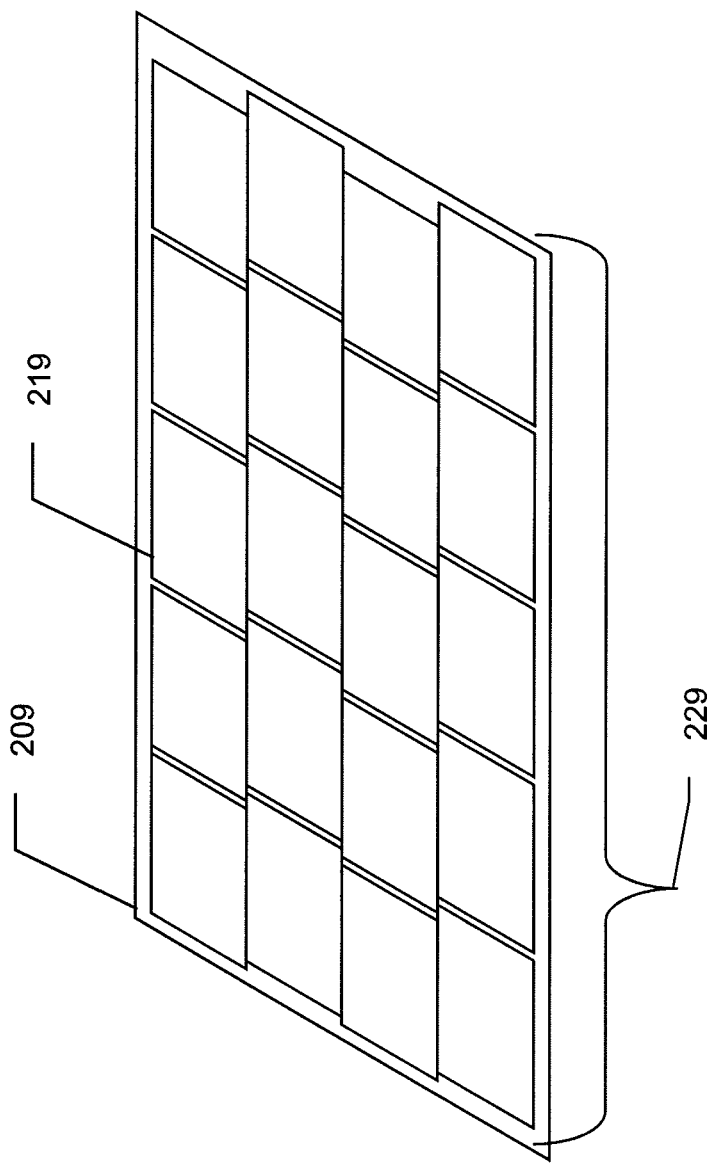

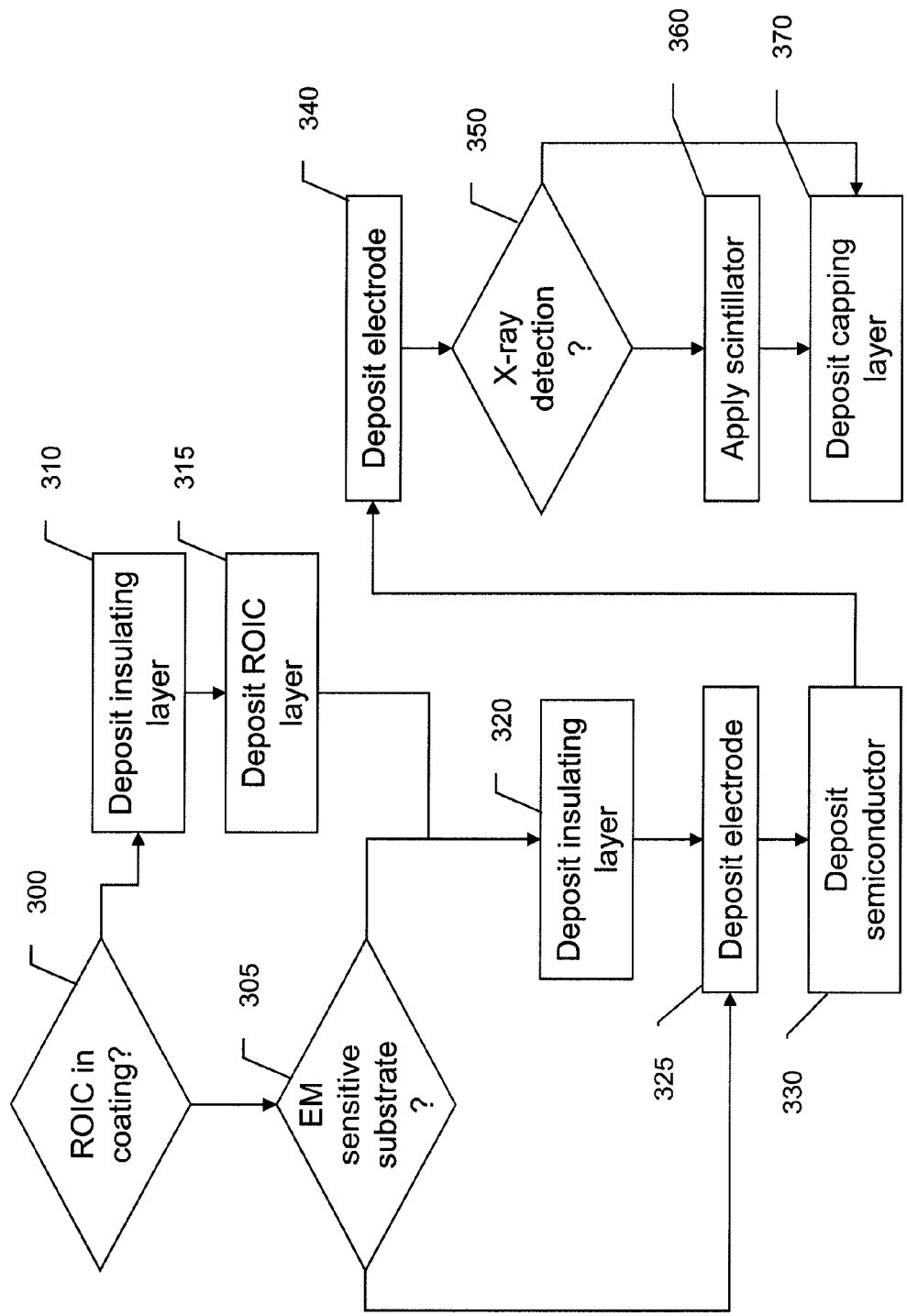

CONFORMAL ELECTROMAGNETIC (EM) DETECTOR

PRIORITY

The present application is a continuation in-part of U.S. patent application Ser. No. 12/904,854, filed in the U.S. Patent and Trademark Office on Oct. 14, 2010, the entire contents of which are hereby incorporated by reference.

FIELD OF THE INVENTION

The present invention relates generally to electromagnetic and electro-optical detection solutions to protect components or information stored in electronic or optical modules, components of a printed circuit or wiring board, or in integrated circuits or optical devices.

BACKGROUND OF THE INVENTION

Organic devices are quickly replacing standard silicon-based devices due to the ability to use inexpensive roll-to-roll processing for higher throughput. Organic light emitting diodes (OLEDs) and organic photovoltaic (PV) cells are two such examples. OLEDs are now commonplace in small displays and in cell phones because of the advantages over LCD screens (e.g. no backlighting required, photonic materials are printed inexpensively, etc.). Organic PV cells offer flexibility and the ability to wrap the cells around and over curved surfaces, unlike those made from silicon wafers. With the ability to print and deposit the layers of these organic optoelectronic materials, a host of possibilities is open for the surfaces upon which these devices can be placed and for the form factor of these devices.

Such techniques allow for the possibility of conformal EM detectors that can be smaller, lighter, cheaper, and applied to any sort of contoured surface.

X-ray detection, for instance, is normally accomplished through the use of a specialized x-ray film or a plate-like detection device. Such detection solutions tend to be heavy and bulky. They also are usually flat, requiring that the subject of an x-ray be positioned in potentially uncomfortable and/or otherwise cumbersome positions to properly image a particular component portion or body part.

Alternate solutions for EM detection include other types of silicon-based detectors that house both the detector(s) and the electronics for processing the signals from the detector(s). In such cases, if/when the detector degrades and/or fails, the whole detector system must be replaced.

SUMMARY OF THE INVENTION

In view of the foregoing, it would be an advance in the art to create inexpensive, conformal, organic-based detectors that can be replaced/maintained/updated independently of the associated read-out electronics. It would also be an advance in the art to create a conformal EM and/or x-ray detection coating that can be easily applied to a wide range of surfaces of varying shape and contour. It would also be an advance in the art to create a conformal EM detection coating that can be easily removed to allow for maintenance of the underlying components and/or substrates.

Aspects of the present invention are directed at solving the problems associated with bulky EM detectors and non-removable EM detection films. Certain aspects relate to the removal and re-application of EM shielding coatings to components. Although the variations discussed herein refer to x-ray detectors for medical applications, the detectors in other variations may be infra-red, ultra-violet, millimeter-wave, or other electro-optical frequency detectors and the applications in other variations may include scanning or detection of scanning attempts for electronic components, optical components, or mechanical components.

Some aspects of the present invention are related to EM detection coatings having one or more layers. In one variation an insulating and/or protective layer may be deposited over the detecting portion/layer.

Variations of a deposition process for an insulating/protective layer may include spraying, dispensing, powder-coating, laminating, painting, vapor deposition, flame spray, or submerging the component(s) in a desired insulating/protective material such as elastomer, silicone, latex, ceramic, glass, or other suitable material which may allow for easy removal of the coating. Variations of a protective layer may include directly written silicone or sprayed-on urethane. Further variations of a protective layer may include acrylic, parylene, kraton, noryl, etc. In some cases, a urethane layer may provide improved adhesion between the protective layer and the coated surface.

For variations using a pliable material such as silicone, elastomer, resin, latex, rubber, or plastic, a variation of a deposition process may include applying a viscous or partially liquid form of a suitable material that may then subsequently cure or dry into a solid, flexible coating. Other variations may include applying semi-solid gels that remain viscous or are otherwise non-curing. Yet other variations may include applying a granular or powder-based, solid coating that may then be treated with heat and/or solvents to form a continuous layer. Further variations still may include using an epoxy, coating, or adhesive whose adhesion and/or flexibility properties may be altered by applying a current or voltage to it.

Variations having an insulating/protective layer may then be further processed such that an EM-sensitive layer or coating is applied onto the insulating layer. Variations of an EM-sensitive layer may include indicator materials, such as dyes or inks or other electromagnetically responsive substances and/or components such as scintillators. Such indicator materials/components may show changes in color or texture, or provide an electrical, optical, or some other signature indicating a particular level or intensity of EM exposure. Example of such materials may include x-ray films using rare-earth phosphors or any other use of phosphors for conversion of one wavelength to another (for instance, anti-stokes phosphors convert IR to visible, others can convert x-rays to UV or visible light, or can convert UV to visible light)

Yet further variations may include additional layers between the insulating layer and an EM-sensitive layer and/or on top of an EM-sensitive layer. Variations of such layers may act as additional insulating layer(s). Such layers may provide mechanical support/rigidity, corrosion resistance, additional electrical functionality, tamper prevention, CTE mismatch compensation, RF-shielding, heat management, waterproofing, noise reduction, or a wide range of other possible functions/features. In one variation, a silicone electrically insulating layer may provide electrical insulation and waterproofing and corrosion resistance. In other variations materials such as urethane, polystyrene, santoprene, and EPDM rubber may be employed.

Variations of a deposition process may include depositing multiple layers simultaneously. Such a variation may include printer-style deposition of a viscous silicone with a conductive core or a ribbon of ductile material simultaneously deposited on top of said silicone. Some variations of a deposition process may be tailored to deposit one or more coatings that are intended to be removable for the purpose of gaining access to a base or underlying layer for servicing, inspection, modification, etc.

By using a deposition machine (sprayer, direct write, inkjet, etc.) the materials comprising organic PV cells can be printed over components on an electronic circuit board, on an electro-mechanical device, on the surface of a shell or an enclosure, or on any component within a system. Similarly, an active sensing layer can be added to frames, fuselages, cases/packages, medical devices, and/or complex enclosures where such "smart" layers can serve to detect EM energy used to resolve internal structures.

Further scope of applicability of the present invention will become apparent from the detailed description given hereinafter. However, it should be understood that the detailed description and specific examples, while indicating preferred variations of the invention, are given by way of illustration only, since various changes and modifications within the spirit and scope of the invention will become apparent to those skilled in the art from this detailed description.

BRIEF DESCRIPTION OF DRAWINGS

The present invention will become more fully understood from the detailed description given hereinbelow and the accompanying drawings which are given by way of illustration only, and thus are not limitative of the present invention, and wherein:

FIG. 1b depicts another embodiment of a conformal EM detection coating as described herein;

FIG. 3 depicts an embodiment of a conformal EM detection coating deposition process as described herein.

The drawings will be described in detail in the course of the detailed description of the invention.

DETAILED DESCRIPTION OF THE INVENTION

The following detailed description of the invention refers to the accompanying drawings. The same reference numbers in different drawings identify the same or similar elements. Also, the following detailed description does not limit the invention. Instead, the scope of the invention is defined by the appended claims and equivalents thereof.

In one variation, a conformal electro-magnetic detector may include at an electrically insulating layer disposed onto the substrate and/or component surface and an electrically conductive layer that connects electrically to logic or monitoring circuitry disposed on top of the insulating layer.

Figure 1A:
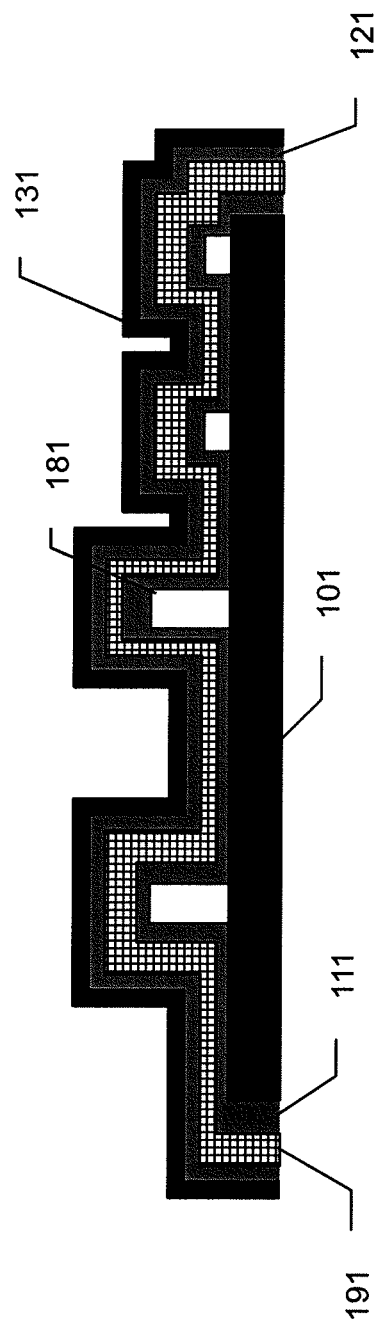
FIG. 1a depicts an embodiment of a conformal EM detection coating as described herein.

A variation of the type discussed above is depicted in FIG. 1a. In the variation shown, a component board 101 having electronic, electro-optical and/or electro-mechanical components 181 mounted thereon is covered with a conformal insulating layer 111 that minimally alters the shape and footprint of the board (if at all). In some variations, the board and components may be subject to surface treatment before the insulating layer 111 is applied. Such surface treatment may reduce the amount or level of adhesion between the board and the elastomeric layer, making it easier to strip or remove at a later time. Variations of surface treatments may include dips, sprays, plasma treatments, etching, ashing, and other known surface modification techniques.

Some such variations may include an elastomeric insulating layer 111 that includes materials such as silicone, elastomer, resin, latex, rubber, and similar flexible substances. Such variations of an insulating layer 111 may be configured, based on the material properties of the layer and the underlying component(s) 101, 181, to be easily removable such that the underlying components 181 may be accessed for maintenance, repair, or re-configuration.

In other variations, an electrically insulating layer 111 may be deposited as a permanent coating onto a substrate component 181 or component assembly 101. Such variations may be useful in situations where the components 181 are not meant to be modified or should otherwise be sealed/coated to prevent or restrict access thereto.

Some variations may include a ground plane disposed between the components(s) and the electrode layer 191. Such a ground plane may be disposed above or included as part of the insulating layer 111 in some variations.

Variations of an electrically conductive electrode layer 191 may include fully metallized layers/regions, regions of conductive inks or epoxies (such as ones that include silver flakes or particles), printed or plated conduction pathways, embedded circuit components, and connections to read-out circuitry. In some variations, such read-out connections may be distinct/separate from the coated substrate/component. In other variations, the electrodes themselves may be the read-out connections that lead to any monitoring and/or data collection circuitry or components.

In some variations, the insulating layer 111 may include a bottom insulating layer and a top insulating layer, and the read-out circuitry may be included in one or more layers disposed between the insulating layers. In other variations, the read-out circuitry may be wholly distinct from the conformal EM detector or the coated substrate/component, with connectors leading from the electrode layer 191 to an external read-out device. In yet further variations, the read-out circuitry may be included as part of the coated component 181, 101. In such variations, the electrode layer may be connected to backshell points on the underlying component 101.

In yet further variations, the electrode layer 191 may be divided into pixel regions. In some variations, each pixel region may be associated with a memory storage or some other image data capture capability. Such memory storage may capture and maintain image data captured from a pixel region for later read-out via external and/or separate image data read-out devices. In some variations of memory storage, the memory storage may be re-set and/or cleared when the captured image data is read-out.

In some variations, a microchip can be embedded into the coating matrix using a tape automated bonding (TAB) technique or other chip lead to matrix conductor interface. In some variations, the microchip can be self powered by an embedded battery to perform real-time monitoring of the coating matrix. Row/column conductors of the coating matrix can be routed directly to the microcircuit to record pixel information. Variations of such information can be in the form of a charge which would be converted to an 8 bit/16 bit etc. digital signal for storage in the microchip. In some variations, the microchip may have in internal analog to digital convertor for processing the charge data. In other variations, the chip may be an analog device or may be part of a micro-circuit that includes multiple modules for different specialized purposes (i.e. one for signal conversion, one for data processing, etc.). In some variations, the microcircuit could reset the charge detecting matrix like any standard CCD. For variations using non-charge type of sensors, like a matrix of conductors, the data could be detected directly as a digital signal (broken or not broken) and stored into the microcircuit. If the microcircuit is not detecting a charge event or a broken conductor event then, in some cases, no storage would occur. When compromise is detected, the information could be saved as a single image where the maximum charge level could represent a quantifiable amount of energy. This information could then be date/time stamped for later analysis and evaluation.

In some variations, the microcircuit could be continually detecting an x-ray event that records on/off data to sense how long the board was x-rayed. In such variations, x-ray phosphor may be deposited directly over the charge detecting layer which picks up the light emitted from the x-ray phosphor. During x-ray illumination the phosphor would emit a steady brightness of light which is pickup by the charge layer and shifted to the microcircuit for analog to digital conversion.

Variations of a electrode layer 191 may be disposed onto the insulating layer 111 such that the electrode layer 191 strongly adheres to, or even bonds with, the insulating layer 111. In some variations, both the electrode 191 and insulating layers 111 may remain flexible such that the adhered/bonded combination layer may be easily peeled back or stripped from the underlying substrate 101 or component(s) 181 in order to allow for coating replacement and/or access to the component (s) for maintenance, repair, or reconfiguration.

In some variations where the coated substrate 101 or component 181 is not electrically or electro-magnetically active or responsive and does not require an insulating/passivation layer, a electrode layer 191 may be deposited without an insulating layer. In other variations, where the coated component 181 is electrically or electro-magnetically active or responsive, or where there are underlying layers between the electrode layer 191 and the component that include circuit elements such as read-out circuitry, one or more passivation layers 111 may be disposed between the electrode layer and the component and/or circuit element bearing layer(s).

In some variations, a electrode layer 191 may be applied such that it adheres strongly to the insulating layer, creating a conformal, strippable EM-detection coating. Such a variation may be useful for size- or weight-limited components where modification or maintenance is not important. In further layer variations, a electrode layer 191 may be applied such that it is strippable from the insulating layer 111.

In some variations meant for medical imaging, the electrode layer 191 may be applied such that it can be readily and easily removed from the insulating layer 111 without damaging the insulating layer. Such variations may allow for a readily replaceable, flexible detection coating. In some variations configured for anti-tamper solutions, the electrode layer may be applied such that removal of the electrode layer renders a coated component inoperable or otherwise unusable until a new electrode layer is re-applied.

An organic or polymeric semiconductor material layer 121 may then be deposited over the areas defined as the electrode (s) 191. An electrode layer 131 may then be deposited over the active (electrode) regions to create detector devices and complete the circuit path to the logic or monitoring circuitry.

The electrode layer 131 is preferably transparent at least to the electro-optical wavelengths to be detected by the detector devices. For detector variations involving a phosphor or scintillator (not shown), the electrode 131 is preferably transparent to visible light. The top electrode may be made of indium tin oxide (ITO), but it typically requires sputtering or evaporation techniques for deposition to achieve a high degree of transparency. ITO can be deposited using thick-film techniques, such as those in the proposed embodiment, to achieve thicknesses of 10-30 µm and <80% transparency.

In some variations, a conductive polymer can be used for the electrode 131. One variation may employ an electrode 131 of poly(3,4-ethylenedioxythiophene) poly (styrenesulfonate) (PEDOT: PSS). PEDOT and ITO are used extensively in display industries for their relatively high electrical conductivities and high transmission of light through the material.

For a detector variation meant as an x-ray detector, a scintillator may be required for the conversion of high-energy x-rays to lower energy photons. In an x-ray detector variant, scintillation material (not shown) would be deposited over the detectors created by the electrode 191, semiconductor 1s1 and electrode 131 layers to complete the sensing portion of the devices.

Variations of a phosophor may be a single layer that is sprayed or deposited via direct write, vapor deposition, or other suitable deposition technique. In some variations meant for medical applications, a phosphor with little or no hygroscopic properties may be desirable to improve scintillator and detector usable life. Such variations may include undoped Cesium Iodide, Cesium Iodide doped with Thalium, LYSO, and Yttrium Aluminum Garnet, among others.

In some variations, an additional layer or layers may be necessary to physically and chemically protect the devices. Some scintillator materials are hygroscopic and may require protection from moisture, and some organic semiconductor materials are susceptible to degradation from moisture as well. Some variations may therefore have an over coating that serves as an impermeable layer to prevent degradation of the device(s).

FIG. 1b shows a electrode layer 209 separated into pixel regions 219. In some variations, each pixel region on the electrode layer may be associated with a read-out data interface (not shown). In other variations, each row 229 or column of electrode layer 209 pixels 219 may be associated with a particular data read-out interface to extract image data from the pixels 219.

Figure 1C:
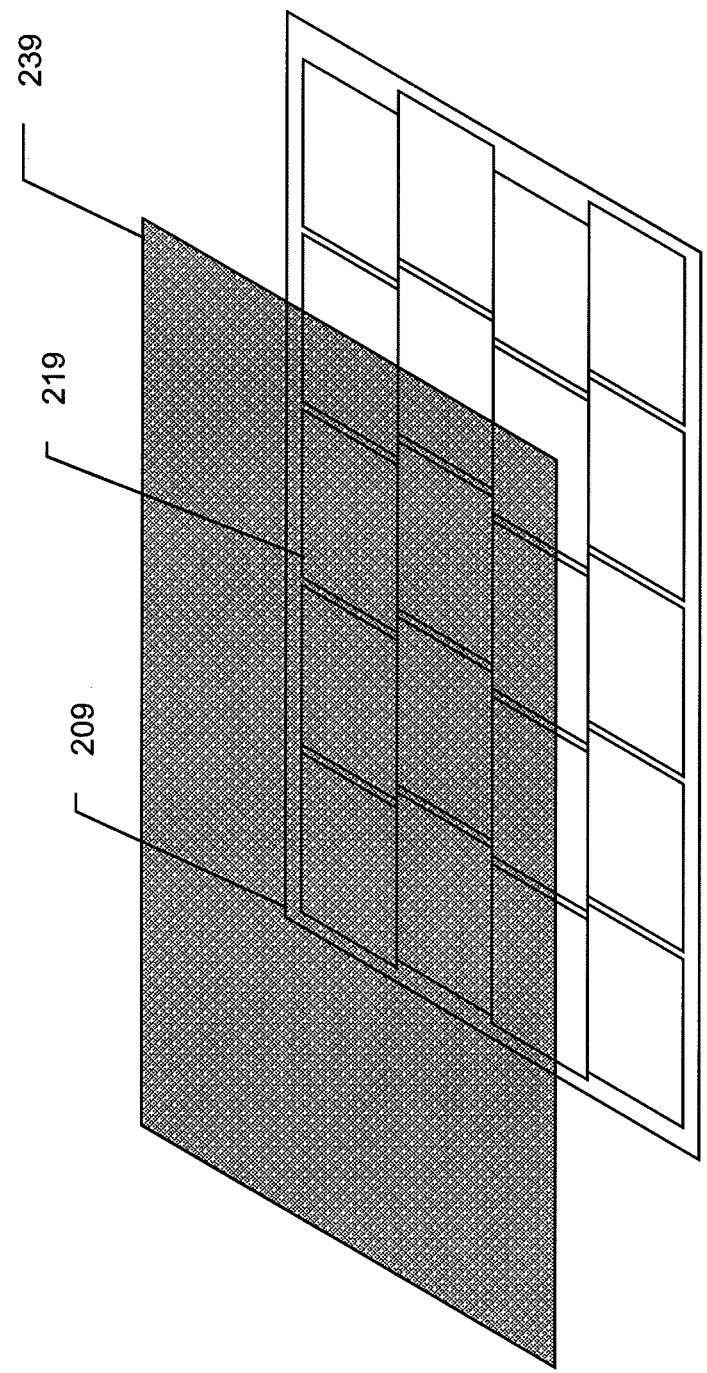
FIG. 1c depicts an embodiment of a conformal EM detection coating as described herein.

FIG. 1c shows a semiconductor layer 239 disposed above the electrode layer. The semiconductor layer is the layer responsible for the actual photo-detection. In some variations, a semiconductor layer may include two adjacent layers of semiconductor material that form a p-n junction so that the semiconductor layer 239 may function as a photo-diode. In other variations, nanocrystalline oxide polymer composites, such as CdSe/P3HT blends, PEDOT:PS, and similar substances, may be used as the semiconductor layer.

Figure 1D:
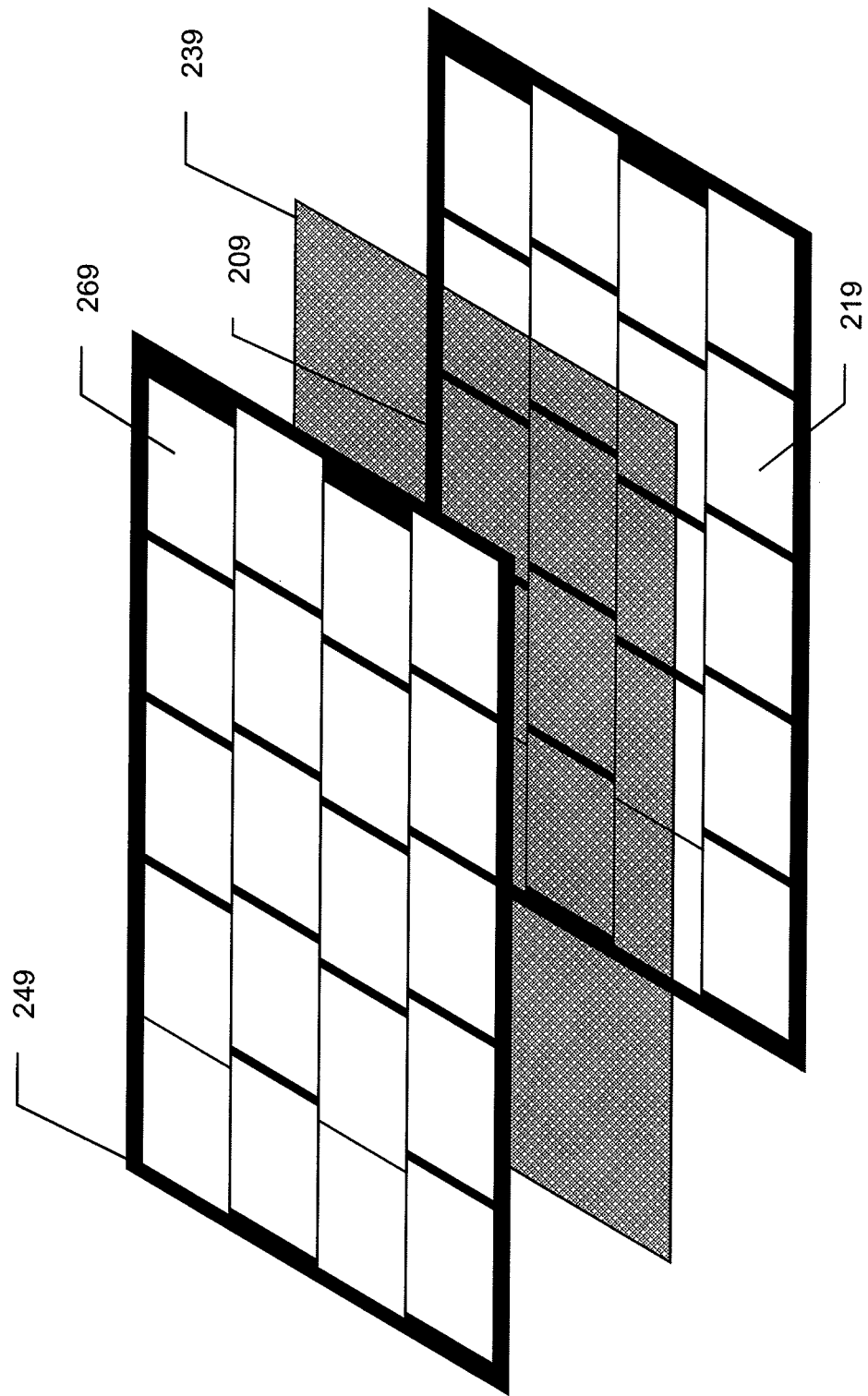
FIG. 1d depicts another embodiment of a conformal EM detection coating as described herein.

FIG. 1d shows the electrode layer 249 disposed over the semiconductor layer 239. The electrode layer may also be separated into pixel regions 269. In some variations, either the anode 249 or cathode 209 layer may be separated into pixels. In other variations, both may be pixilated. In some variations, the electrode 249 and electrode 209 layers may allow for bias-reversal. A semiconductor layer 239 may then be used to capture/detect different ranges of electro-optical radiation frequencies in forward-biased and reverse-biased modes.

Figure 1E:
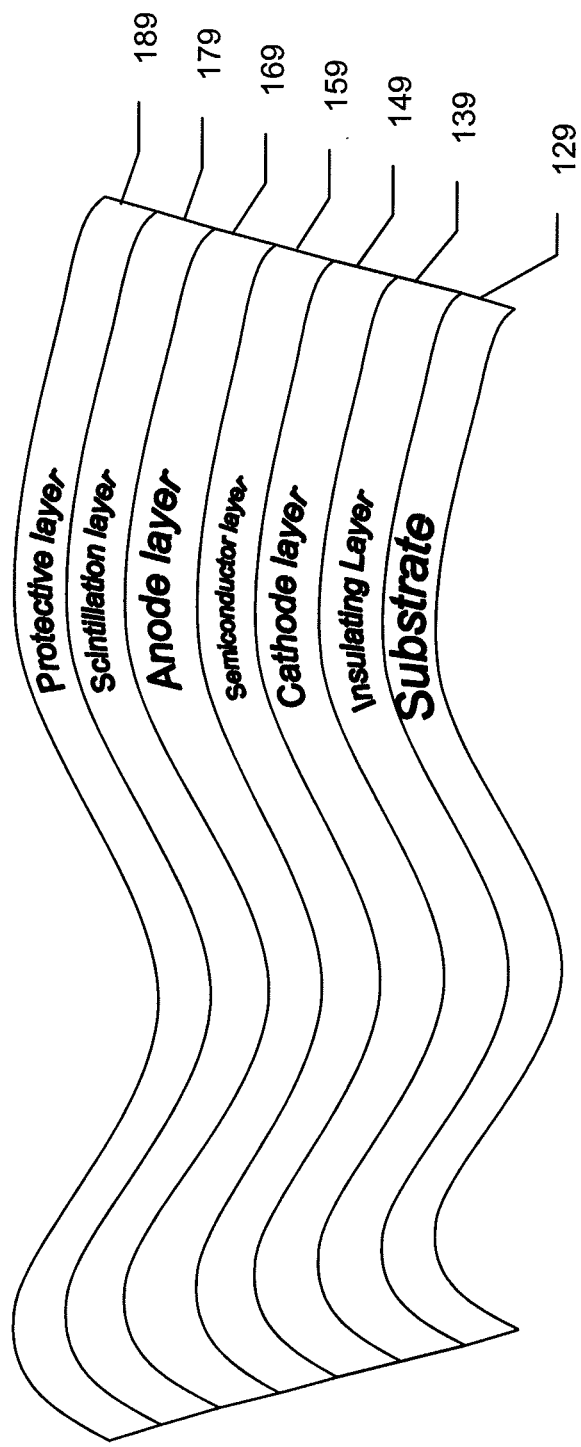
FIG. 1e depicts an embodiment of a conformal EM detection coating as described herein.

FIG. 1e shows an embodiment of a conformal x-ray detector for a curved substrate/component surface. In such an embodiment, the substrate 129 may be a medical device such as a full or partial mouthpiece for dental x-rays, a body-shaped shell x-ray detectors, a vehicle component such as a wing, faring, door, window, bumper, fuselage, other vehicle components, a device shell/enclosure such as a casing for a computer or video player or game console, a component enclosure such as a camera or cell phone body, a piece of luggage, a secure envelope, or any other surface or portion of a device where it may be desirable to detect attempts at x-ray imaging.

An insulating layer 139 may be disposed on the substrate. Such an insulating may be consistent with the variations discussed above with respect to FIG. 1a. Some variations may include a strippable insulating 139 layer so that the substrate may be stripped and re-coated at the end of the EM detection coating's useful life. Other variations may include an insulating substrate 129 or otherwise combine/integrate the insulating 139 and substrate 129 layers.

The electrode 149, semiconductor 159, and electrode 169 layers may then be disposed onto the insulating layer 139 or the substrate 129. In variations where the substrate is also the insulating layer, or where the insulating layer is otherwise integrated with or bonded to the substrate, the electrode layer 159 may be configured and/or deposited such that it is strippable from the insulating layer 139 to allow for EM detection coating replacement.

For variations where x-ray detection is desired, a scintillation layer 179 is disposed over the electrode layer. The scintillation layer includes a scintillator material that converts incoming x-ray radiation into photons for detection by the electrode-semiconductor-electrode detector assembly. The scintillation layer 179 is then preferably covered with a protective layer 189 that protects the underlying layers from physical and environmental damage.

In some variations, the curved substrate 129 may also include electronic, optical, and/or electro-mechanical components. In an x-ray detection embodiment, the substrate 129 may include read-out circuitry that connects to data interface leads from/in the electrode layer. In such embodiments, a ground plane may be included between the substrate and the electrode layer. In some variations, the ground plane may be part of the insulating layer 139.

Deposition on a curved surface may be accomplished via direct-write systems, sputtering, vapor deposition, and plating. Variations using direct-write deposition may be preferred as they may be less prone to thickness variation within a layer caused by surface contour.

In one preferred x-ray detecting embodiment, the insulating layer 139 may be made of silicone, the semiconductor 159 may be made of a nanocrystalline oxide polymer composite (such as a CdSe/P3HT blend or PEDOT:PS, the anode layer 169 may be made of a transparent material such as indium tin oxide (ITO) to allow photons from the scinillator 179 to reach the semiconductor 159, the scintillator 179 may be a non-hygroscopic one such as Cesium Iodide (doped or un-doped) and the protective barrier 189 may be made of urethane, polystyrene, rubber, EPDM rubber, vinyl, lacquer, resin, or other suitable materials for protecting a component from wear or environmental damage while still allowing for x-ray transmission.

Figure 1F:
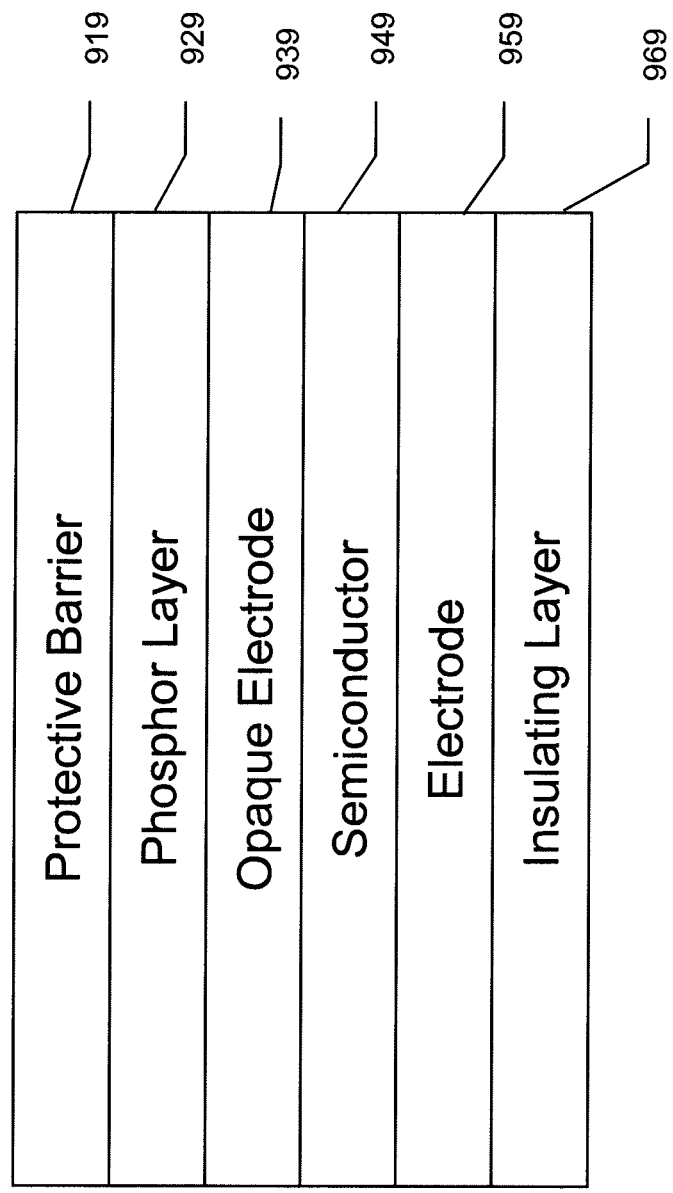
FIG. 1f depicts another embodiment of a conformal EM detection coating as described herein.

FIG. 1f shows a variation of a conformal x-ray and/or em-detector configured for anti-tamper solutions. In the variation shown, a photo-detector may be deposited onto a surface or insulating layer 969. Such a detector may have a electrode layer 959, a semiconductor layer 949, and an opaque electrode layer 939. Disposed above the opaque electrode layer may be a scintillation 929 or photo-emission or phosphorescent layer. Such a layer may emit light either upon being stimulated or continuously due to material properties or a bias applied thereto—or both. Additionally, an optional protective barrier layer 919 may be applied over the phosphor layer 929

In such a variation, a breach in the opaque electrode layer 939 will cause the semiconductor 949 to generate photo-current based on light absorbed from the phosphor layer 929 via the breach. Such photo-current will be detected by the remaining, intact portions of the photo-detector and output as detected signal indicating a tamper attempt.

Figure 1G:
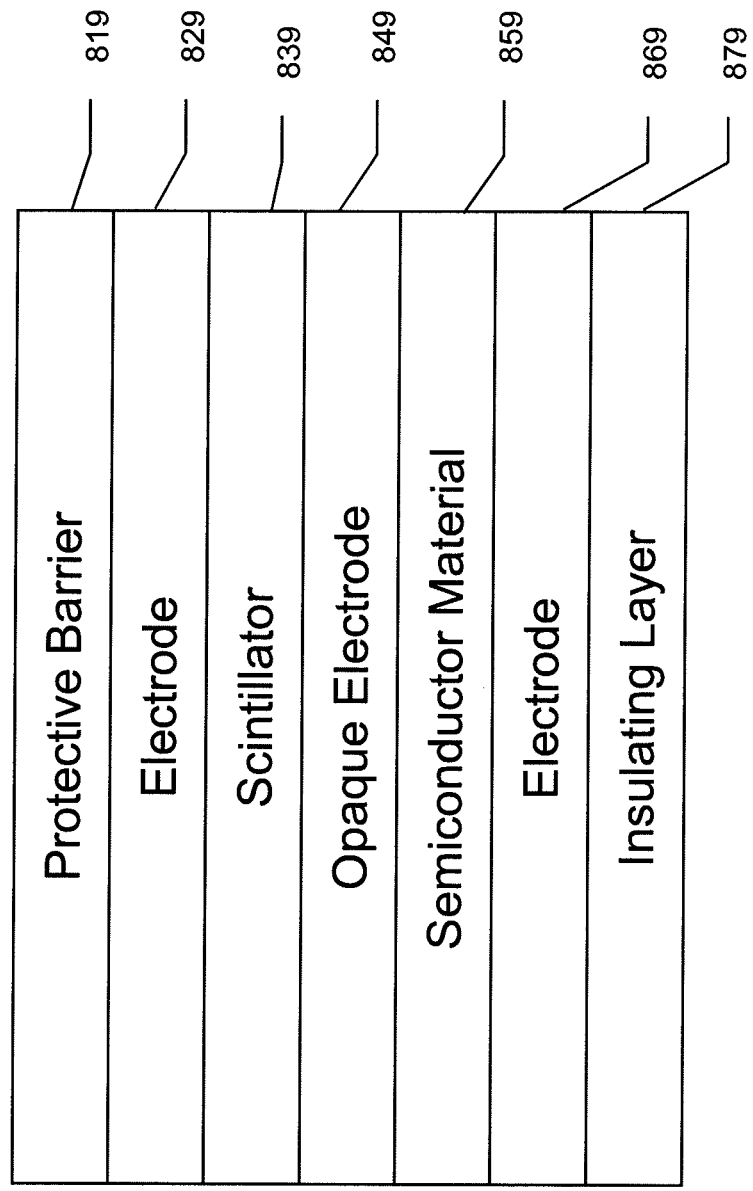
FIG. 1g depicts an embodiment of a conformal EM detection coating as described herein.

FIG. 1g shows a variation of an anti-tamper solution with an emitter layer that has a bias applied thereto for emission. As in the variation shown in FIG. 1f, an opaque electrode 849, semiconductor layer 835 and electrode 869 may be deposited on a surface or an insulating layer 879. A scintillator or light-emitting layer 839 may be disposed above the opaque electrode 849 such that a breach in the opaque electrode layer 849 will cause the semiconductor 859 to generate photo-current based on light absorbed from the light-emitting layer 839 via the breach. Such photo-current will be detected by the remaining, intact portions of the photo-detector and output as detected signal indicating a tamper attempt.

In this embodiment, however, an electrode 829 is applied to the light-emitting layer 839 in order to stimulate light emission. As in the previous embodiment, an option protective barrier layer 819 may be applied over the electrode 829 for added protection.

Figure 2A:
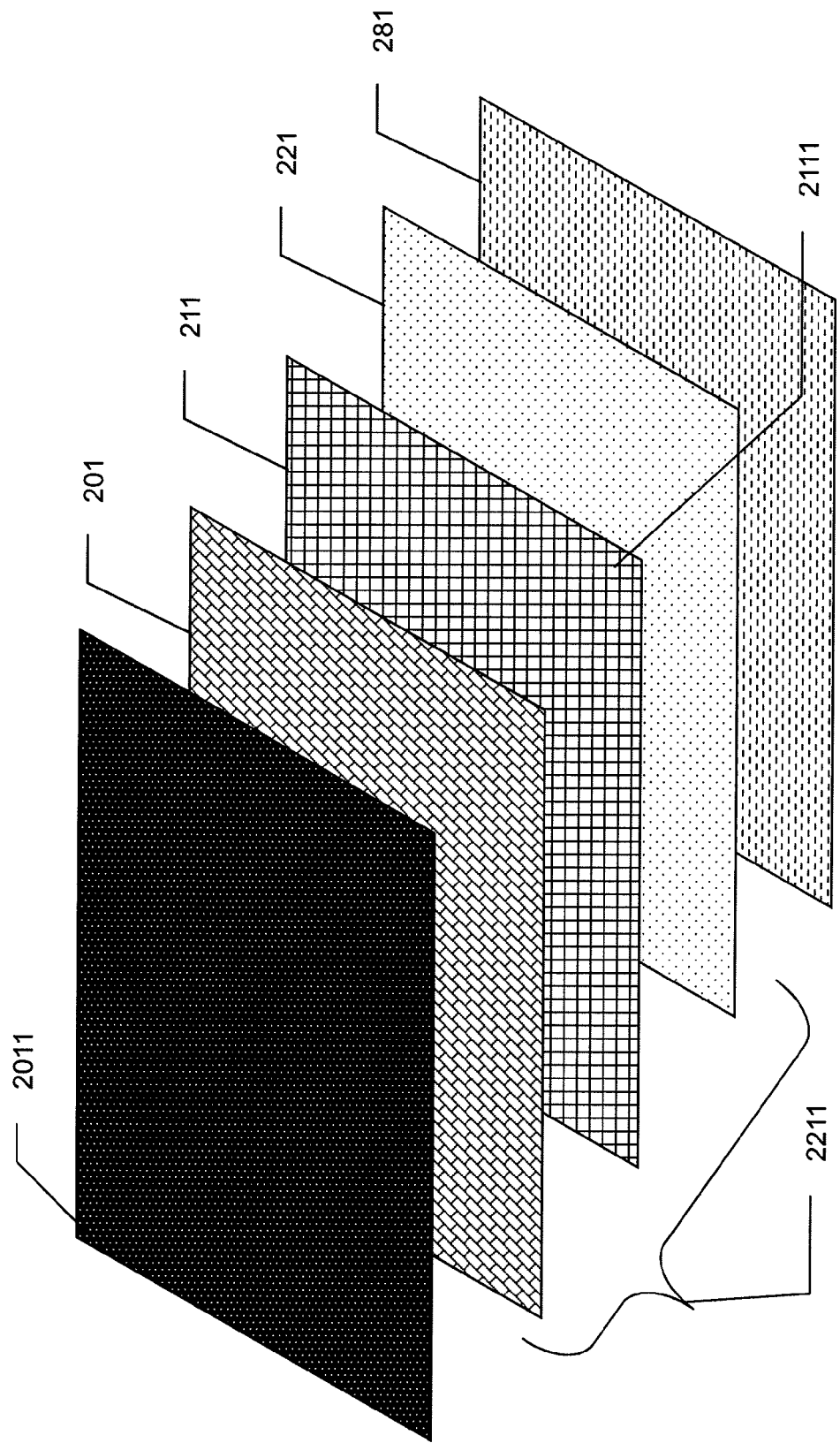
FIG. 2a depicts an embodiment of a conformal EM detection coating as described herein.

A variation of a multi-layer conformal EM detector is depicted in FIG. 2a. In the variation shown, an insulating layer 281 may be disposed on a substrate (not shown) as either a strippable or non-strippable layer. An electrically conductive electrode layer 221 may then be deposited onto the insulating layer in order to begin forming the EM detector. A semiconductor layer may then be deposited on the electrode layer 211 to create one or more active detection regions 2111. An electrode layer 201 may then be deposited onto the active detection regions 2111 of the semiconductor layer to complete the EM detector array 2211. In some variations, a capping or covering layer 2011 may then be deposited onto the electrode layer 201 to provide some measure of protection from environmental factors or wear/use damage.

Variations of a capping layer may include urethane, polystyrene, rubber, EPDM rubber, vinyl, lacquer, resin, or other materials suitable for protecting a component from excessive wear, environmental damage (moisture, chemicals), or jarring impacts. In an alternate variation, an intervening layer (not shown) may disposed between the electrode layer 221 and the insulating layer 281 to provide CTE compensation, shock absorption, and/or waterproofing, heat containment or heat dissipation, or additional conductive portions for components/circuits in the substrate.

Variations of an insulating layer 281 may also be configured to provide some measure of EM shielding to the substrate. Some variations may include broad-spectrum or tailored EM shields and shielding materials. In one variation, a metallic foil may be deposited over a strippable elastomeric layer in order to provide light-weight, low-cost, broad-spectrum EM shielding. In other variations, specific material compositions and shapes may be introduced into the insulating layer such that it can be tailored to provide added protection against particular EM frequencies and/or allow passage of specific frequency ranges.

In further variations, a capping layer 2011 may also be equipped with some measure of EM shielding. An capping layer 2011 made of a wire mesh or an electrically conductive, transparent material, such as indium tin oxide (ITO), and disposed over a clear or IR-transparent elastomer, for instance, may provide EM shielding while still permitting visual or IR-based EM detector arrays 2211 to operate effectively.

In some variations, the EM detection array 2211 may be replaced or augmented with an electromagnetically responsive ink or dye that provides a visual indication of EM radiation exposure. In some variations, such an ink or dye may indicate the extent/intensity of exposure based on changes in the ink or dye. In some variations, such an ink or dye may be visible only under certain wavelengths of light, such as particular infra-red or ultra-violet frequencies. A conformal EM detector array equipped with such an ink or dye may be electro-optically scanned to determine an illumination intensity profile of the EM radiation. In some variations meant for x-ray detectors, pixel-sized areas having an x-ray responsive ink or dye may be deposited as the EM detection array 2211 along with optically transparent insulating 281 and capping 2011 layers. Such variations may allow for readily strippable, conformal x-ray detection films that can be molded onto devices that patients wear for purposes of x-ray imaging. Other variations may allow for readily strippable imaging indicators that can be applied as part of an anti-tamper/anti-intrusion solution.

In a medical device variation, a mouth-piece may have an x-ray detecting coating applied thereto and used for dental x-rays. In variations having an optically visible ink or dye, the coating may then be stripped from the mouth-piece and immediately viewed as an x-ray image without requiring that the film be developed or otherwise processed first. In an anti-tamper variation, scanning/inspection of the detecting coating may allow for a determination of where and/or how an imaging attempt was made.

In some variations where an EM detection coating is augmented by the addition of EM-responsive inks or dyes, the inks or dyes may be part of the capping layer 2011 to provide an immediate visual indicator of an imaging attempt. Such variations may be useful for indicating imaging attempts for anti-tamper purposes as well as, in some variations, for coating replacement purposes.

In the variation shown in FIG. 2a, read-out circuitry may be disposed either in the substrate or otherwise separate from the EM detection array 2211. In such a variation, the electrode layer 221 may be attached or otherwise connected to a data read-out interface such as a contact pad (or pads) or one or more connectors to enable interaction with a read-out circuit or device that collects image data from the EM detection array 2211.

Figure 2B:
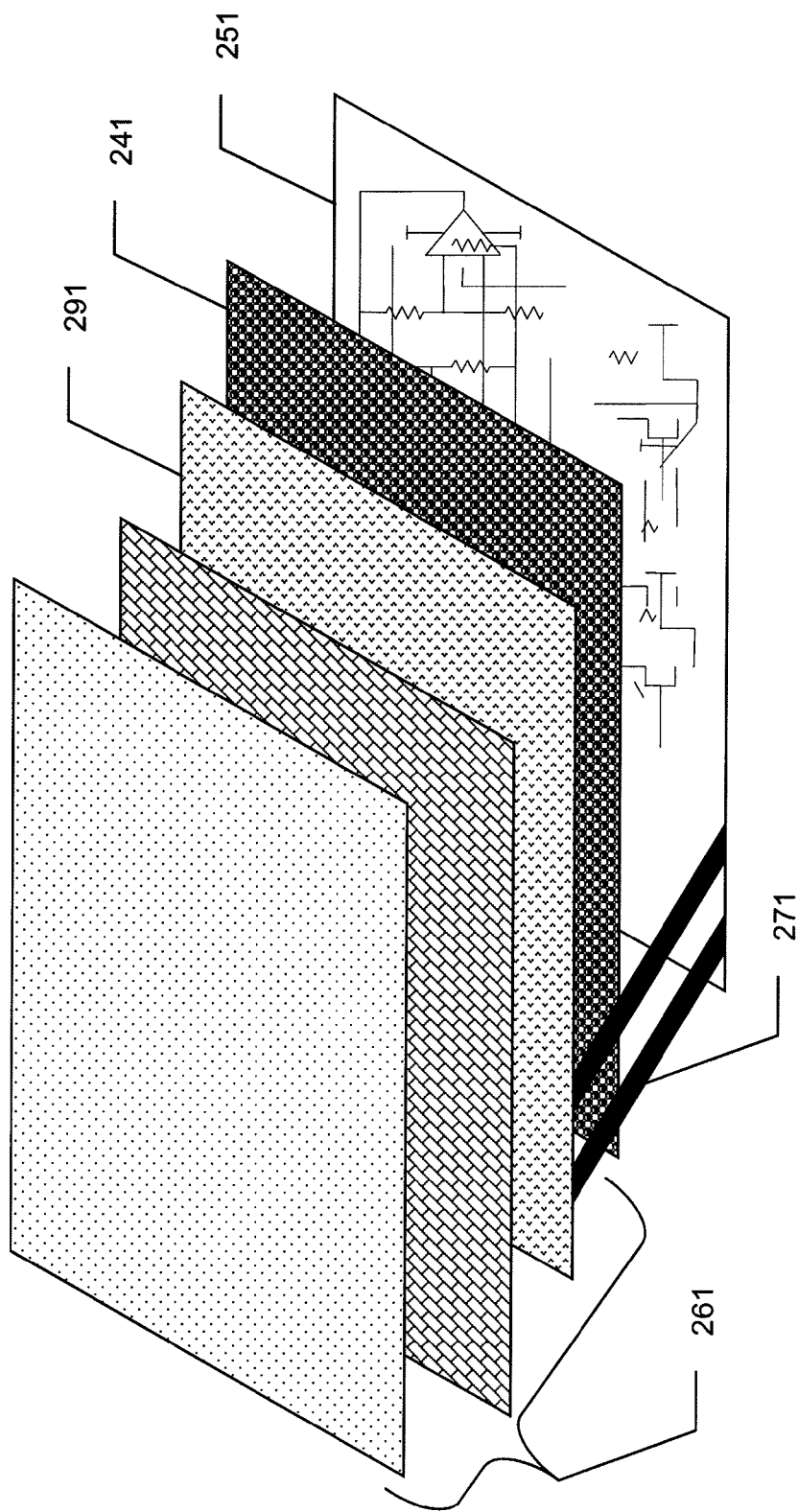
FIG. 2b depicts another embodiment of a conformal EM detection coating as described herein.

Another variation of a conformal EM detector is depicted in FIG. 2b. In this variation, the detector coating may include a layer of read-out circuitry 251 disposed below an insulating layer 241 to separate the read-out circuitry from the electrode layer 291 of the conformal EM detector array 261. In some such variations, the insulating layer may include vias, connectors, or other interface points to enable read-out of image data from the EM detector array 261 by the read-out layer 251. In other variations, interconnects may be established on a per-column or per-row basis along the edge of the detection coating 271. Such interconnects enable read-out of image data from the EM detection array 261 to be performed in the conformal EM detection coating. A connection (wired or wireless) to downstream processing and display components (such as, for instance, circuitry embedded in a substrate or otherwise connected to the read-out circuit) may then enable processing, analysis, and/or display of the read-out image data.

In an x-ray detection variation, the insulating layer may also be an x-ray attenuating layer that protects the read-out circuitry from x-ray exposure. In further such variations, a read-out microcircuit could be continually detecting an x-ray event that records on/off data to sense how long the board was x-rayed. In such variations, x-ray phosphor may be deposited directly over the charge detecting layer which picks up the light emitted from the x-ray phosphor. During x-ray illumination the phosphor would emit photons detected by the charge layer and shifted to the read-out microcircuit for analog to digital conversion. In an anti-tamper variation, such a coating may be connected to a memory or storage portion on or associated with a coated device to capture images of the immediate surroundings.

Another aspect of the present invention relates to methods for creating and applying a conformal EM shield coating to a component or substrate. One variation of an application method is depicted in FIG. 3.

Once it is determined whether the production process is configured to create a 'smart' detector array having integrated read-out circuitry 300, it must be further determined or established whether or not the read-out circuitry will require one or more insulating layers or ground planes. In a variation without a ground plane, a read-out layer may be deposited 315 directly onto the substrate or onto an insulating layer. Otherwise, a ground plane or insulating layer 310 may be deposited to protect the underlying component from potential interference due to the components in the read-out layer.

In the process depicted, an EM-sensitive substrate 305, such as a circuit or electronic or electro-optical component, may have an insulating layer applied thereto 320. A substrate that is not EM-sensitive may bypass the use of an insulating layer and have a electrode layer applied directly thereon 325. In variations where a coating includes read-out circuitry, the read-out circuitry may be regarded as the EM-sensitive substrate on which another insulating layer is deposited 320.

In some variations, a substrate may have its surface treated prior to depositing the insulating or electrode layer in order to decrease or otherwise modify component surface adhesion. When the insulating layer is deposited 320 on the potentially treated surface, it may not adhere strongly to the component—making the insulating layer and all layers applied thereon strippable or otherwise readily removable.

In a variation of the process, a surface treatment operation to increase the surface adhesion of the component or substrate may be performed, making the subsequently applied insulating layer 320 or electrode layer 325 non-strippable or otherwise strongly attached to the component. In yet further variations, surface treatment prior to deposition of an insulating layer may be omitted entirely.

After the insulating layer is applied, it may be subjected to surface treatment in order to increase or otherwise modify its surface adhesion before a electrode layer is applied 320. Such a treatment may be useful to increase or otherwise alter the adhesion between the electrode layer and the insulating layer. In some variations, the electrode layer may be deposited 320 by one or more of direct-write deposition, painting, spraying, dipping, physical vapor deposition, chemical vapor deposition, sputtering, screen printing, MBE, plasma-assisted deposition, and plating.

After depositing the electrode layer, a semiconductor layer 330 may be deposited. Once the semiconductor layer is in place, the electrode layer is deposited 340 over the semiconductor pixel areas to complete the EM detection array.

In variations meant for x-ray detection 350, a phosphor or scintillator material layer may then be applied 360 onto the electrode layer to convert incoming x-ray radiation into detectable electro-optical signals that the EM detection array can process.

In yet further variations, a capping layer may be deposited 370 either onto the electrode layer or the phosphor or scinillator. A capping layer may be deposited to provide environmental or wear/impact protection to the component-bearing layer and/or to any layers underneath the capping layer.

Variations of a conformal EM detection coating and/or an associated coating production/deposition process according to the present invention may be used anywhere that conventional EM detection and/or x-ray detection is used. One variation of such a coating could be used in the medical industry to provide lightweight, non-bulky x-ray detection films for use on limited-mobility patients that cannot be easily or readily re-positioned. Furthermore, by using flexible organic materials, a molded or non-planar detector may be used to image areas that were previously difficult or impossible using current technologies.

X-ray systems typically use bulky tables with slots therein for film or use detector plates or panels. A selectively depositable EMI detection coating based on organic semiconductors could provide a low-cost alternative. Fixed and removable embodiments may be suitable depending on the expected lifetime of a coated component and its anticipated maintenance/upgrade needs.

Another area of application for variations of the conformal EM detection coating may be for anti-tamper solutions where it would be useful to know or monitor imaging attempts or other non-destructive examination of secure and/or sensitive components.

The invention being thus described, it will be obvious that the same may be varied in many ways. Such variations are not to be regarded as departure from the spirit and scope of the invention, and all such modifications as would be obvious to one skilled in the art are intended to be included within the scope of the following claims.

The invention claimed is:

1. A conformal electromagnetic (EM) detector, the detector comprising:
a conformal electrically insulating layer configured to conform to and he disposed over at least part of a component;
a first conformal electrode layer disposed over said conformal electrically insulating layer;
a conformal semiconductor layer disposed over said first conformal electrode layer;
a second conformal electrode layer disposed over said conformal semiconductor layer; and
a capping layer disposed on top of said second conformal electrode layer, wherein the capping layer provides at least one of mechanical rigidity, corrosion resistance, waterproofing, and temperature control;
wherein at least one electrode layer of the first conformal electrode layer and the second conformal electrode layer is divided into pixel regions and where the at least one electrode layer has at least one connection or a connection point for read-out of EM detection data.

2. The detector of claim 1. where said component is an electronic component.

3. The detector of claim 1, said detector further including a memory storage portion that captures the EM detection data captured from a pixel region of the at least one electrode layer.

4. The detector of claim 3, where said memory storage portion includes a microchip or a microcircuit configured with an analog-to-digital signal converter.

5. The detector of claim 4, where said microchip or said microcircuit is configured to reset a charge detecting matrix in the divided layer after data read-out.

6. The detector of claim 3, where said memory storage portion stores information about a detector compromise event as a single image having a time-stamp.

7. The detector of claim 3, the detector further comprising a scintillation layer disposed over said second conformal electrode layer.

8. The detector of claim 7, where said scintillation layer is configured to convert incident x-ray radiation into visible-spectrum radiation for detection.

9. The detector of claim 7, where the second conformal electrode layer is transparent to visible light.

10. The detector of claim 9, where said second conformal electrode layer is made of indium tin oxide (ITO).

11. The detector of claim 7, where the scintillation layer includes a phosphor with little or no hygroscopic properties.

12. The detector of claim 3, where each pixel region is associated with a data read-out interface.

13. The detector of claim 1, where the conformal electrically insulating layer is configured to be easily peeled or stripped back from said component.

14. The detector of claim 1, where said conformal electrically insulating layer is an elastomeric layer.

15. The detector of claim 1, the detector further comprising a ground plane disposed between said conformal electrically insulating layer and said first conformal electrode layer.

16. The detector of claim 1, where the conformal semiconductor layer includes two adjacent layers of semiconductor material that form a p-n junction, causing the conformal semiconductor layer to function as a photo-diode.

17. The detector of claim 1, where the conformal semiconductor layer includes one or more nanocrystalline oxide polymer composites.

18. A conformal X-ray detector comprising:
a conformal and flexible electrically insulating layer configured to conform to a body part;
an electrode-semiconductor-electrode photon detector assembly comprising:
a first conformal electrode layer disposed over the conformal and flexible electrically insulating layer;
a conformal semiconductor layer disposed over the first conformal electrode layer; and
a second conformal electrode layer disposed over the conformal semiconductor layer;
a capping layer disposed on top of said second conformal electrode layer, where the capping layer provides at least one of mechanical rigidity, corrosion resistance, waterproofing and temperature control;
wherein at least one electrode layer of the first conformal electrode layer and the second conformal electrode layer is divided into pixel regions and wherein the at least one electrode layer has at least one connection or a connection point for read-out of EM detection data;
a conformal scintillation layer disposed over the electrode-semiconductor-electrode photon detector assembly, the conformal scintillation layer comprising a scintillator material configured to convert incoming X-ray radiation into photons for detection by the electrode-semiconductor-electrode photon detector assembly; and
a capping layer disposed on top of said conformal scintillation layer, wherein the capping layer provides at least one of mechanical rigidity, corrosion resistance, waterproofing, and temperature control.

19. A conformal electromagnetic (EM) detector, the detector comprising:
   a conformal electrically insulating layer configured to conform to and be disposed over at least part of a component;
   a first conformal electrode layer disposed over said conformal electrically insulating layer;
   a conformal semiconductor layer disposed over said first conformal electrode layer; and
   a second conformal electrode layer disposed over said conformal semiconductor layer;
   wherein at least one electrode layer of the first conformal electrode layer and the second conformal electrode layer is divided into pixel regions and where the at least one electrode layer has at least one connection or a connection point for read-out of EM detection data; and
   a memory storage portion configured to capture the EM detection data captured from a pixel region of the at least one electrode layer.

20. A conformal electromagnetic (EM) detector, the detector comprising:
   a conformal electrically insulating layer configured to conform to and be disposed over at least part of a component, the conformal electrically insulating layer being configured to be easily peeled or stripped back from said at least part of the component;
   a first conformal electrode layer disposed over said conformal electrically insulating layer;
   a conformal semiconductor layer disposed over said first conformal electrode layer; and
   a second conformal electrode layer disposed over said conformal semiconductor layer;
   wherein at least one electrode layer of the first conformal electrode layer and the second conformal electrode layer is divided into pixel regions and where the at least one electrode layer has at least one connection or a connection point for read-out of EM detection data.

21. A conformal electromagnetic (EM) detector, the detector comprising:
   a conformal electrically insulating layer configured to conform to and be disposed over at least part of a component;
   a first conformal electrode layer disposed over said conformal electrically insulating layer;
   a conformal semiconductor layer disposed over said first conformal electrode layer, the conformal semiconductor layer comprising two adjacent layers of semiconductor material that form a p-n junction, causing the conformal semiconductor layer to function as a photo-diode; and
   a second conformal electrode layer disposed over said conformal semiconductor layer;
   wherein at least one electrode layer of the first conformal electrode layer and the second conformal electrode layer is divided into pixel regions and Where the at least one electrode layer has at least one connection or a connection point for read-out of EM detection data.

22. A conformal electromagnetic (EM) detector, the detector comprising:
   a conformal electrically insulating layer configured to conform to and be disposed over at least part of a component;
   a first conformal electrode layer disposed over said conformal electrically insulating layer;
   a ground plane disposed between said conformal electrically insulating layer and said first conformal electrode layer;
   a conformal semiconductor layer disposed over said first conformal electrode layer; and
   a second conformal electrode layer disposed over said conformal semiconductor layer;
   wherein at least one electrode layer of the first conformal electrode layer and the second conformal electrode layer is divided into pixel regions and where the at least one electrode layer has at least one connection or a connection point for read-out of EM detection data.

23. A conformal X-ray detector comprising:
   a conformal and flexible electrically insulating layer configured to conform to a body part;
   an electrode-semiconductor-electrode photon detector assembly comprising:
      a first conformal electrode layer disposed over the conformal and flexible electrically insulating layer;
      a conformal semiconductor layer disposed over the first conformal electrode layer; and
      a second conformal electrode layer disposed over the conformal semiconductor layer;
      a capping layer disposed On top of said second conformal electrode layer, where the capping layer provides at least one of mechanical rigidity, corrosion resistance, waterproofing, and temperature control;
      wherein at least one electrode layer of the first conformal electrode layer and the second conformal electrode layer is divided into pixel regions and wherein the at least one electrode layer has at least one connection or a connection point for read-out of EM detection data;
   a memory storage portion that captures the EM detection data captured from a pixel region of the at least one electrode layer; and
   a conformal scintillation layer disposed over the electrode-semiconductor-electrode photon detector assembly, the conformal scintillation layer comprising a scintillator material configured to convert incoming X-ray radiation into photons for detection by the electrode-semiconductor-electrode photon detector assembly.

* * * * *

UNITED STATES PATENT AND TRADEMARK OFFICE
CERTIFICATE OF CORRECTION

| | | |
|---|---|---|
| PATENT NO. | : 8,947,889 B2 | Page 1 of 1 |
| APPLICATION NO. | : 13/211131 | |
| DATED | : February 3, 2015 | |
| INVENTOR(S) | : Matthew Kelley et al. | |

It is certified that error appears in the above-identified patent and that said Letters Patent is hereby corrected as shown below:

In the claims

In claim 1, column 11, lines 45-47, replace:

"a conformal electrically insulating layer configured to conform to and he disposed over at least part of a component;" with --"a conformal electrically insulating layer configured to conform to and be disposed over at least part of a component;"--.

In claim 21, column 14, line 3, replace:

"is divided into pixel regions and Where the at least one" with --"is divided into pixel regions and where the at least one"--.

In claim 23, column 14, line 35, replace:

"a capping layer disposed On top of said second conformal" with --"a capping layer disposed on top of said second conformal"--.

Signed and Sealed this
Thirteenth Day of October, 2015

Michelle K. Lee
*Director of the United States Patent and Trademark Office*